United States Patent
Klein et al.

(10) Patent No.: US 7,516,661 B2
(45) Date of Patent: Apr. 14, 2009

(54) Z OFFSET MEMS DEVICE

(75) Inventors: Jonathan L. Klein, Redmond, WA (US);
Galen P. Magendanz, Issaquah, WA (US); Peter H. LaFond, Redmond, WA (US); Mark L. Williams, Seattle, WA (US); Michael J. Foster, Issaquah, WA (US)

(73) Assignee: Honeywell International Inc., Morristown, NJ (US)

( * ) Notice: Subject to any disclaimer, the term of this patent is extended or adjusted under 35 U.S.C. 154(b) by 74 days.

(21) Appl. No.: 11/360,870

(22) Filed: Feb. 23, 2006

(65) Prior Publication Data
US 2007/0193380 A1    Aug. 23, 2007

(51) Int. Cl.
*G01P 15/00* (2006.01)
*G01P 15/125* (2006.01)
(52) U.S. Cl. .................... 73/514.32; 73/514.01
(58) Field of Classification Search .. 73/514.01–514.38
See application file for complete search history.

(56) References Cited

U.S. PATENT DOCUMENTS

| | | | |
|---|---|---|---|
| 5,340,955 A * | 8/1994 | Calvillo et al. ........... 200/302.2 |
| 5,817,942 A | 10/1998 | Greiff | |
| 6,277,666 B1 | 8/2001 | Hays et al. | |
| 6,633,426 B2 * | 10/2003 | Shrauger et al. ............. 359/290 |
| 6,768,589 B2 * | 7/2004 | Deutsch et al. ............. 359/572 |
| 2002/0144548 A1 | 10/2002 | Cohn et al. | |
| 2002/0178817 A1 * | 12/2002 | Selvakumar et al. ....... 73/514.32 |
| 2003/0054588 A1 * | 3/2003 | Patel et al. ................... 438/107 |
| 2004/0052657 A1 * | 3/2004 | Van Lintel et al. .......... 417/322 |
| 2004/0245871 A1 * | 12/2004 | Kim et al. .................. 310/75 A |
| 2005/0136621 A1 | 6/2005 | Ridley et al. | |
| 2005/0139967 A1 | 6/2005 | Eskridge et al. | |
| 2005/0194650 A1 | 9/2005 | Hung | |
| 2005/0205951 A1 | 9/2005 | Eskridge | |
| 2005/0264452 A1 * | 12/2005 | Fujishima et al. ..... 343/700 MS |
| 2006/0066964 A1 * | 3/2006 | Greywall ..................... 359/849 |
| 2007/0119252 A1 * | 5/2007 | Adams et al. .................. 73/510 |

OTHER PUBLICATIONS

Selective Stiction Based Vertical Comb Actuators; Jongbaeg Kim, Dane Christensden and Liwei Lin; Berkeley Sensor & Actuator Center, University of California, Berkeley; pp. 403-406.

Micromachined Inertial Sensors; Navid Yazki, Farrokh Ayazi, and Khalil Najafi; Proceedings of the IEEE, vol. 86, No. 8, Aug. 1998; pp. 1640-1659.

Vertical Comb-Finger Capacitive Actuation and Sensing for CMOS-MEMS; Huikai Xie and Gary K. Fedder; 2002 Elsevier Science B.V.; pp. 212-221.

* cited by examiner

*Primary Examiner*—Harshad Patel
*Assistant Examiner*—Punam Patel
(74) *Attorney, Agent, or Firm*—Black Lowe & Graham PLLC

(57) ABSTRACT

A microelectromechanical system (MEMS) device with a mechanism layer having a first part and a second part, and at least one cover for sealing the mechanism layer. The inner surface of at least one of the covers is structured such that a protruding structure is present on the inner surface of the cover and wherein the protruding structure mechanically causes the first part to be deflected out of a plane associated with the second part.

12 Claims, 4 Drawing Sheets

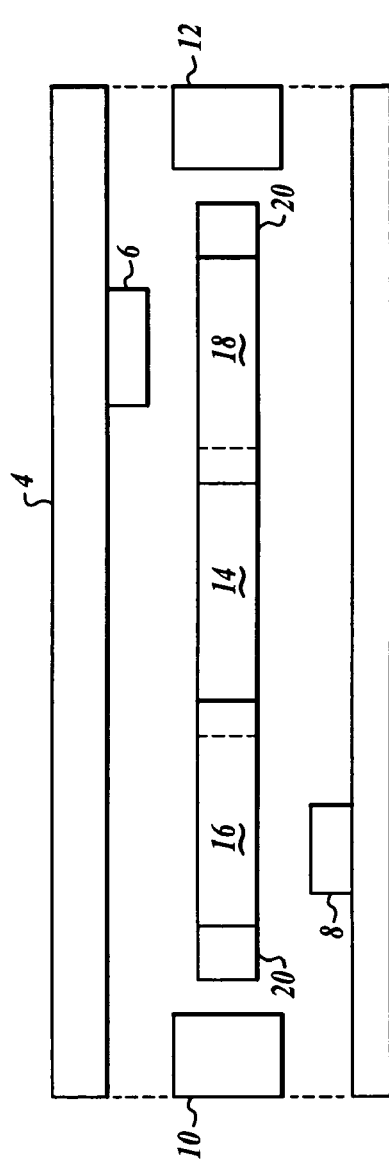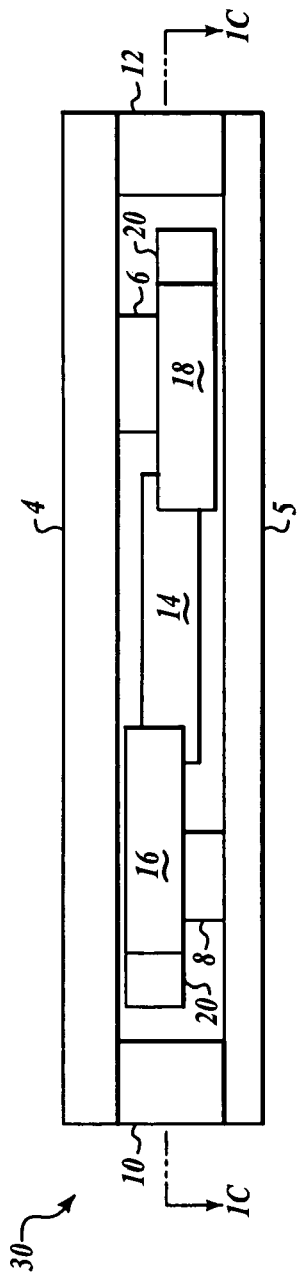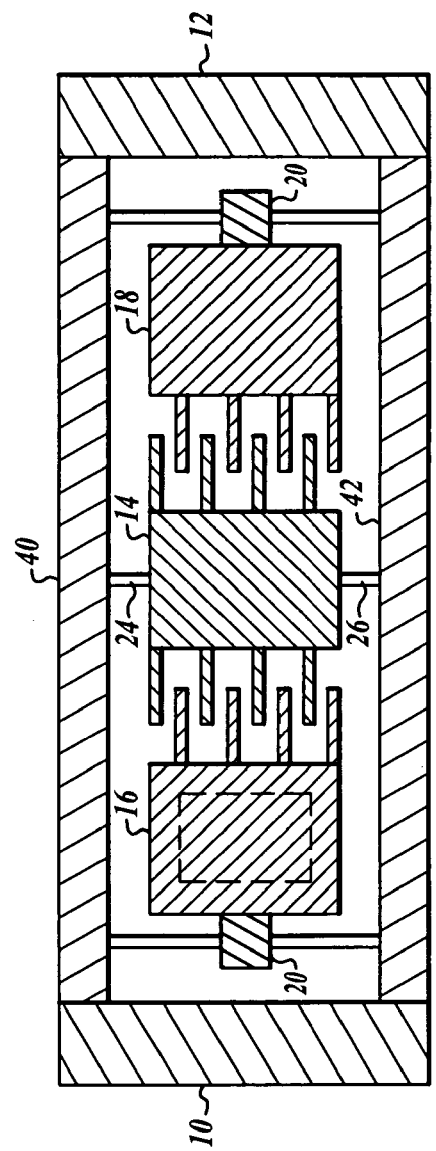

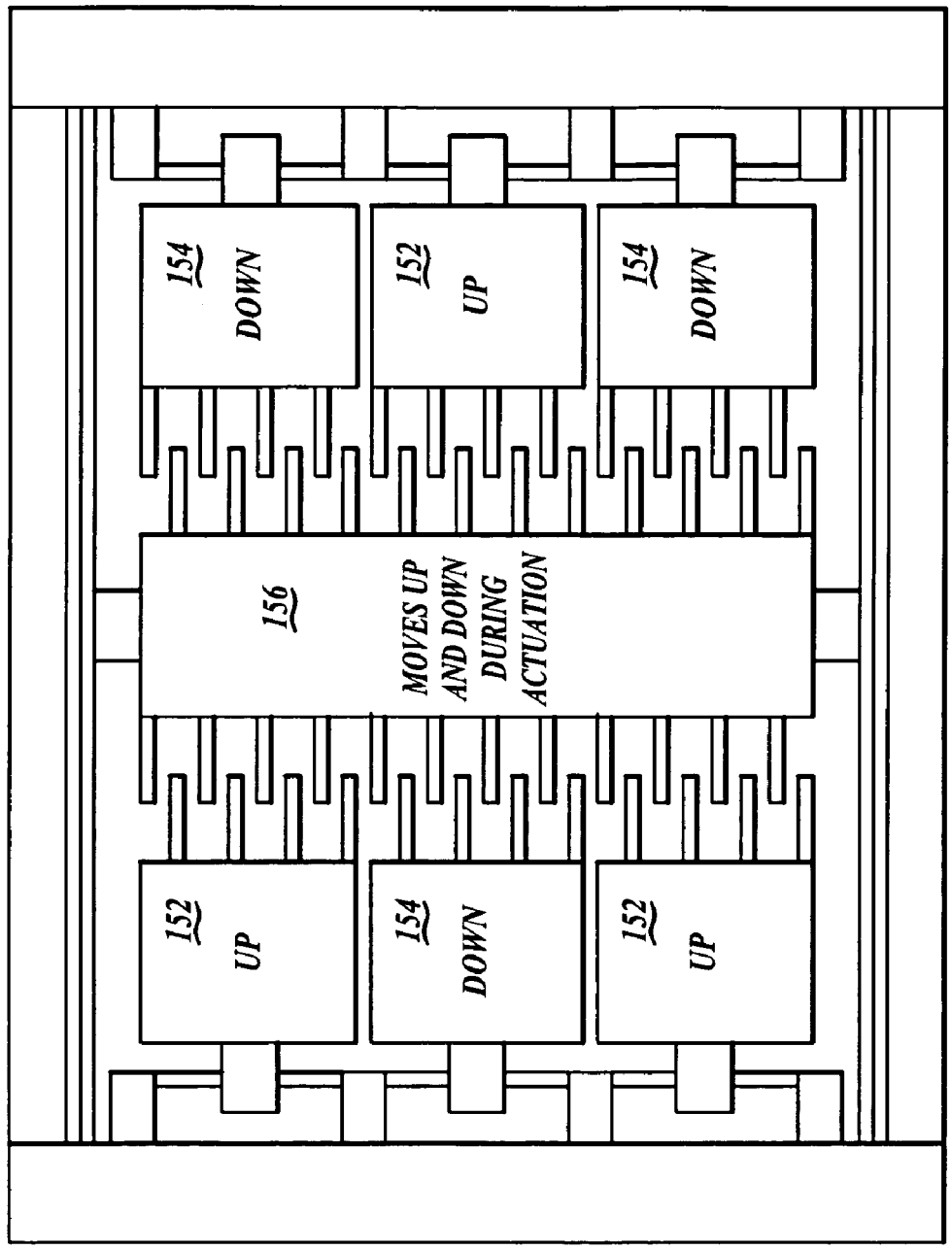

Z OFFSET MEMS DEVICE

BACKGROUND OF THE INVENTION

Standard microelectromechanical systems (MEMS) processing techniques create structures that are symmetric in the z axis (out of the wafer's surface) but can vary in the x and y axes (in the plane of the wafer's surface). This leads to devices which can only move in the x/y plane. Presently, creating asymmetry in the z-axis can be performed by deflecting with stiction plates or by selective thinning. Deflecting with stiction plates leads to devices which are sensitive to z motion, but is not easily implemented for multiple z-offsets in both directions and also requires more steps and additional processing layers, thereby costing more money. Selective thinning is performed by thinning one set of teeth in the Z-direction, but this requires an extra mask and additional etches, and it is also rather inaccurate.

Thus, there exists a need for methods to easily form z-offsets in MEMS devices.

BRIEF SUMMARY OF THE INVENTION

A microelectromechanical system (MEMS) device with a mechanism layer having a first part and a second part, and at least one cover for sealing the mechanism layer. The inner surface of at least one of the covers is structured such that a protruding structure is present on the inner surface of the cover and wherein the protruding structure mechanically causes the first part to be deflected out of a plane associated with the second part.

BRIEF DESCRIPTION OF THE DRAWINGS

FIGS. 1A, 1B, and 1C illustrate a cross-sectional side view before assembly, a cross-sectional side view after assembly, and a cross-sectional top view of a microelectromechanical system (MEMS) comb structure device in accordance with one embodiment of the invention;

FIG. 3 illustrates a cross-sectional top view of an additional embodiment of the invention.

DETAILED DESCRIPTION OF THE PREFERRED EMBODIMENT

Figure 2A:
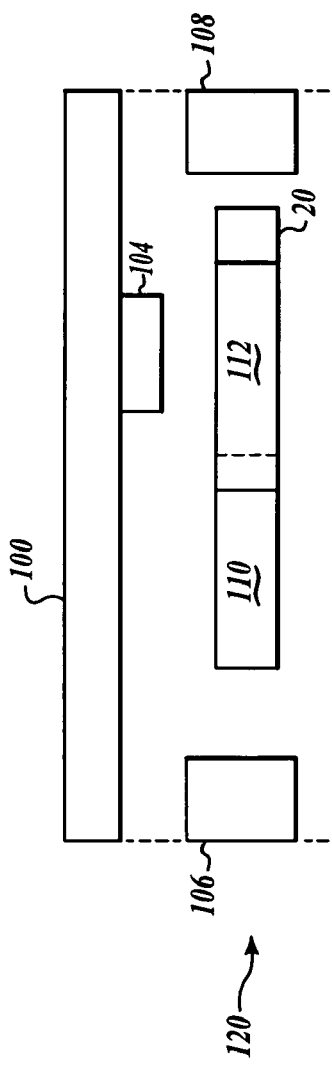
FIGS. 2A, 2B, and 2C illustrate a cross-sectional side view before assembly, a cross-sectional side view after assembly, and a cross-sectional top view of an alternative embodiment of the invention.

FIGS. 1A, 1B and 1C illustrate a side view before assembly, a side view after assembly and a top view of a microelectromechanical system (MEMS) comb structure device 30 formed in accordance with one embodiment of the invention. FIGS. 1A and 1B show that the device 30 has a top cover 4 and a bottom cover 5 enclosing a mechanism layer 32 that includes a first side 10, a second side 12 directly opposite the first side 10, a movable part 14, a first fixed part 16, a second fixed part 18, and flexures 20. Flexures may also be referred to as torsional flexures or as hinges. FIG. 1A illustrates a cross-sectional side view of the comb structure device 30 shown in FIG. 1B before the top cover 4 and the bottom cover 5 have been attached to the device 30. For purposes of FIGS. 1B and 1C, the positive z direction is defined to run from the bottom cover 5 to the top cover 4 such that it is orthogonal to the outer surfaces of both of the covers and orthogonal to the mechanism layer. The top cover 4 has a structure 6 protruding from its inner surface that causes the second fixed part 18 to be mechanically deflected in the negative z direction and away from the plane associated with the movable part 14 when the top cover 4 is attached to the first side 10 and the second side 12. Bottom cover 5 has a structure 8 protruding from its inner surface that causes the first fixed part 16 to be mechanically deflected in the positive z direction and away from the plane associated with the movable part 14 when the bottom cover 5 is attached to the first side 10 and the second side 12.

Cross-sectional top view FIG. 1C shows that the mechanism layer also has a third side 40 and a fourth side 42 so that the movable part 14, the first fixed part 16, and the second fixed part 18 are surrounded on four sides by the first side 10, the second side 12, the third side 40, and the fourth side 42. The movable part 14 is held in place by hinges 24 and 26 attached to the third side 40 and the fourth side 42 which allow the movable part 14 to rotate about the hinges 24 and 26 but keep the movable part relatively fixed with respect to translational movement in the x/y plane. FIG. 1C also illustrates that the movable part 14 is formed such that a series of comb electrodes protrude towards the first fixed part 16 and the second fixed part 18. The first fixed part 16 and the second fixed part 18 include a series of comb electrodes protruding from the side facing the movable part 14. The comb electrodes of the first fixed part 16 and the second fixed part 18 are interleaved with the comb electrodes protruding from the sides of the movable part 14. In another embodiment, a non-sealed device may be formed without using the first side 10, the second side 12, the third side 40, and the fourth side 42. An alternative embodiment based on the non-sealed device could also be formed, where flexures 20 are temporary structures that are put in a dicing space between each comb structure device 30, and removed in a final configuration. In some embodiments, structure 6 will be bonded to the second fixed part 18 and structure 8 will be bonded to the first fixed part 16.

Figure 2B:
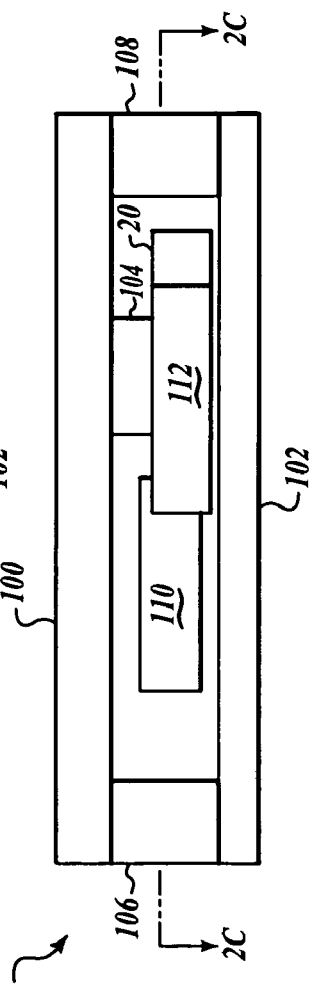
Figure 2C:
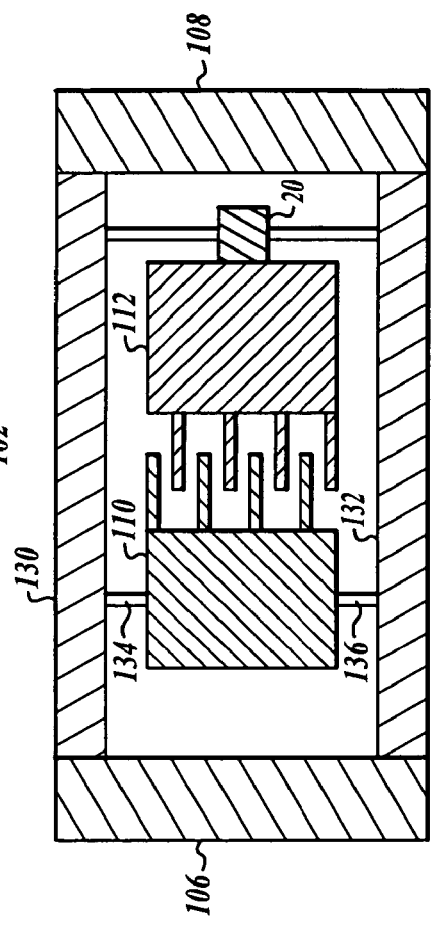

FIGS. 2A, 2B, and 2C illustrate a cross-sectional side view before assembly, a cross-sectional side view after assembly, and a cross-sectional top view of an alternative embodiment of the invention. FIGS. 2A and 2B show that a device 80 has a top cover 100 and a bottom cover 102 enclosing a mechanism layer 120 that includes a first side 106, a second side 108 directly opposite the first side 106, a movable part 110, a fixed part 112, and flexure 20. FIG. 2A illustrates a cross-sectional side view of the comb structure device 80 shown in FIG. 2B before the top cover 100 and the bottom cover 102 have been attached to the device 80. For purposes of FIGS. 2B and 2C, the positive z direction is defined to run from the bottom cover 102 to the top cover 100 such that it is orthogonal to the outer surfaces of both of the covers and the mechanism layer 120. The top cover 100 has a structure 104 protruding from its inner surface that causes the fixed part 112 to be mechanically deflected in the negative z direction and away from the plane associated with the movable part 110 when the top cover 100 is attached to the first side 106 and the second side 108. Bottom cover 102 is attached to the first side 106 and the second side 108.

Cross-sectional top view FIG. 2C shows that the mechanism layer also has a third side 130 and a fourth side 132 so that the movable part 110 and the fixed part 112 are surrounded on four sides by the first side 106, the second side 108, the third side 130, and the fourth side 132. The movable part 110 is held in place by hinges 134 and 136 attached to the third side 130 and the fourth side 132 which allow the movable part 110 to rotate about the hinges but keep the movable part relatively fixed with respect to translational movement in the x-y plane. FIG. 2C also illustrates that the movable part 110 is formed such that a series of comb electrodes protrude on the side facing the interior of the device. The fixed part 112 is also shown to each have a series of comb electrodes protruding from the side facing the movable part 110. The comb electrodes of the fixed part 112 are interleaved with the comb electrodes protruding from the side of the movable part 110.

FIG. 3 illustrates a cross-sectional top view of a device 150 that is an additional embodiment of the invention. In this embodiment, more than two parts are deflected. Three fixed parts 152 are deflected up and three fixed parts 154 are deflected down relative to a central comb part 156.

Figure 4:
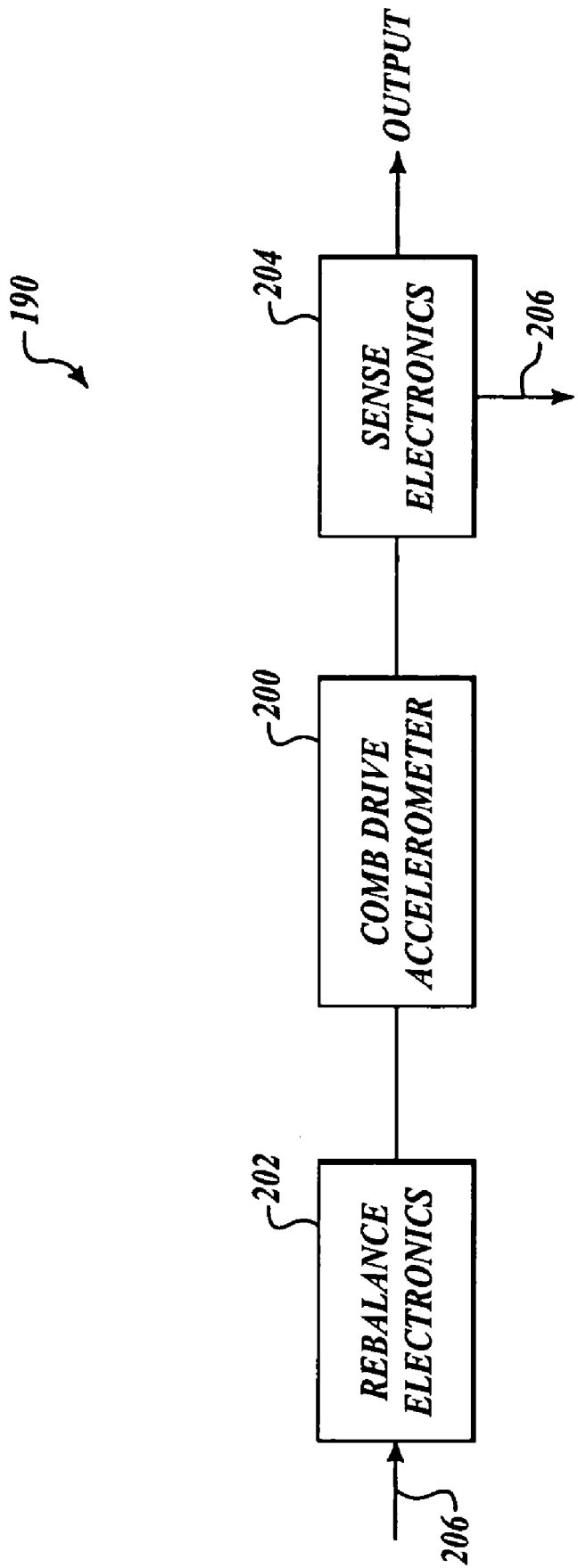
FIG. 4 illustrates a schematic view of a system including one embodiment of the present invention.

FIG. 4 illustrates a schematic view of a system 190 including one embodiment of the present invention. A comb structure accelerometer 200 such as that described in FIGS. 1B and 1C in signal communication with rebalance electronics 202. The rebalance electronics 202 rebalances the comb structure accelerometer 200. Sense electronics 204, receives signals from the comb structure accelerometer 200 and produces a relevant output signal 206 to be used in further processing or storage. The signal 206 can be fed back into the rebalance electronics 202, if closed loop operation is desired.

The structures 6, 8, and 104 protruding from the inner surfaces of the covers 4, 5, and 100 and the covers 4, 5, and 100 themselves may be formed of a monolithic material such as silicon or pyrex, for example, or the structures 6, 8, and 104 may be attached or deposited on the surface of each cover in alternative embodiments. If structures 6, 8, or 104 are attached or deposited on the surface of covers 4, 5, or 100, structures 6, 8, or 104 may be made of the same material such as silicon or pyrex, for example, or a different material such as a metal, for example, as covers 4, 5, and 100. Also, for example, the structures 6, 8, and 104 protruding from the inner surfaces of the covers 4, 5, and 100 could be used to deflect the movable parts 14 and 110 of the devices 30 and 80 instead of or in addition to deflecting the fixed parts 16, 18, and 112.

While the preferred embodiment of the invention has been illustrated and described, as noted above, many changes can be made without departing from the spirit and scope of the invention. Additionally, the MEMS device itself may be a sensor or an actuator acting as a sense mechanism or a drive mechanism. Accordingly, the scope of the invention is not limited by the disclosure of the preferred embodiment. Instead, the invention should be determined entirely by reference to the claims that follow.

What is claimed is:

1. A microelectromechanical (MEMS) device comprising:
a microelectromechanical mechanism layer comprising:
   a first part; and
   a second part located on a first plane; and
at least one cover permanently attached to the mechanism layer for sealing at least a portion of the mechanism layer, the at least one cover comprising:
   an inner surface;
   an outer surface; and
   a structure protruding from the inner surface of the at least one cover, the structure configured to permanently mechanically deflect the first part into a second planes, wherein the first part and the second part include a comb structure.

2. The device of claim 1, wherein one of the at least one cover and the structure protruding therefrom are formed of a monolithic material.

3. The device of claim 1, wherein one of the at least one cover and the structure protruding therefrom are formed of different materials.

4. The device of claim 1, wherein the structure has been attached to the cover.

5. The device of claim 1, wherein the second plane is parallel with the first plane.

6. A microelectromechanical (MEMS) device comprising:
a mechanism layer comprising:
   a first part;
   a second part; and
   a third part; and
a top cover having a first surface;
a bottom cover having a first surface;
a first structure protruding from the first surface of the top cover, the first structure causes the first part to mechanically deflect out of a plane associated with the second part when the top cover is attached to the mechanism layer; and
a second structure protruding from the first surface of the bottom cover, the second structure causes the third part to mechanically deflect out of the plane associated with the second part when the bottom cover is attached to the mechanism layer,
wherein the top cover remains in fixed relation to the bottom cover after attachment to the mechanism layer.

7. The device of claim 6, wherein one of the covers and the associated structure protruding therefrom are formed of a monolithic material.

8. The device of claim 6, wherein one of the covers and the associated structure protruding therefrom are formed of different materials.

9. The device of claim 6, wherein the structures have been attached to the covers.

10. The device of claim 6, wherein the mechanism layer further comprises at least one additional part and the device further comprises at least one additional structure protruding from the inner surface of at least one of the top cover or the bottom cover, the at least one additional structure causes a corresponding one of the at least one additional parts to mechanically deflect out of the plane associated with the second part when the cover from which it is protruding is attached to the mechanism layer.

11. The device of claim 6, wherein the first part, the second part, and the third part form a comb structure.

12. The device of claim 11, wherein the first part, the second part, and the third part sense acceleration in a direction orthogonal to the plane associated with the second part.

* * * * *

UNITED STATES PATENT AND TRADEMARK OFFICE
CERTIFICATE OF CORRECTION

PATENT NO. : 7,516,661 B2  Page 1 of 1
APPLICATION NO. : 11/360870
DATED : April 14, 2009
INVENTOR(S) : Klein et al.

It is certified that error appears in the above-identified patent and that said Letters Patent is hereby corrected as shown below:

In Col. 4, Line 3, the word planes, should read:

"plane,"

Signed and Sealed this

Sixteenth Day of June, 2009

JOHN DOLL
*Acting Director of the United States Patent and Trademark Office*